United States Patent [19]

Walker

[11] 4,045,743
[45] Aug. 30, 1977

[54] DETECTOR CIRCUITS
[75] Inventor: Keith Francis Walker, Woking, England
[73] Assignee: Data Recording Instrument Company Limited, Staines, England
[21] Appl. No.: 679,243
[22] Filed: Apr. 22, 1976
[30] Foreign Application Priority Data
Apr. 24, 1975 United Kingdom ............... 16930/75
[51] Int. Cl.$^2$ ........................................... H03K 5/153
[52] U.S. Cl. ..................... 328/150; 307/354; 307/360
[58] Field of Search .......... 307/235 A, 235 E, 235 N, 307/264, 268, 216; 328/110, 114, 117–119, 132, 150, 162–165; 360/39, 40, 45, 53, 55
[56] References Cited
U.S. PATENT DOCUMENTS
3,617,904 11/1971 Marino ........................... 307/235 A Primary Examiner—John Zazworsky
Attorney, Agent, or Firm—Hane, Sullivan & Spiecens

[57] ABSTRACT

A waveform-level detector circuit is described for use in conjunction with waveforms showing positive and negative excursions about a neutral axis, the waveform trace crossing the axis between positive and negative peaks. Ideally, each axis crossing has significance, but the presence of noise produces spurious crossings and the circuit is arranged to accept as significant only an axis crossing which occurs in a single transition of the waveform trace between reference levels on either side of the axis. However, in detecting such a crossing, its actual timing is not accurately registered, so the apparatus also produces a timing response accurately related to all crossings, significant or not, and then combines this response with accepted crossing signals to derive a final output.

5 Claims, 7 Drawing Figures

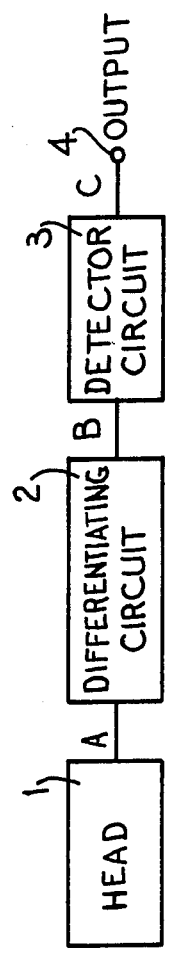
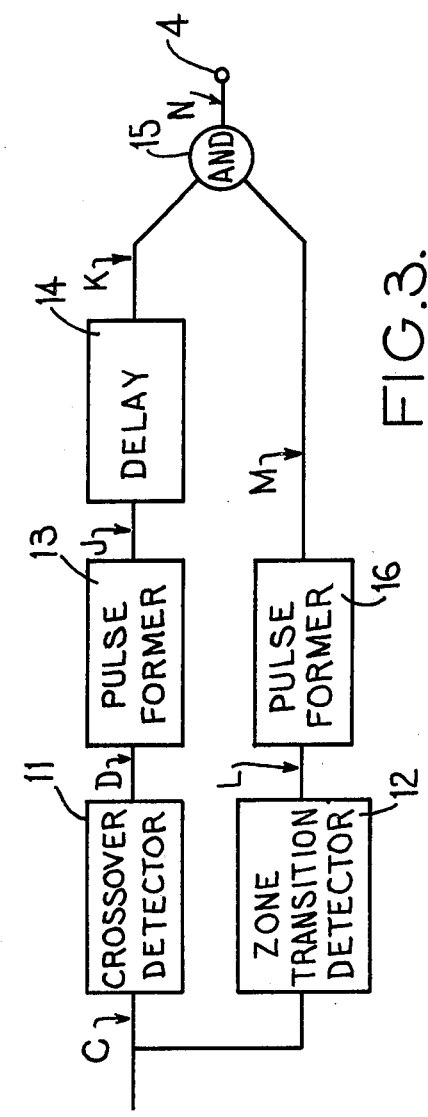
FIG.1.
FIG.3.

DETECTOR CIRCUITS

BACKGROUND OF THE INVENTION

1. Field of the Invention

The present invention relates to waveform-level detectors and to circuits therefor. Such detectors are particularly suited for use in conjunction with applied waveforms having positive and negative excursions relative to a neutral axis.

2. Description of the Prior Art

Such waveforms are frequently produced, for example, in apparatus associated with the recording of digital data and in particular in apparatus for reading data previously magnetically recorded on a magnetic medium by means of a transducer head. Such apparatus may record digital information by flux reversals in the medium which produce positive and negative signals upon being read out. It is customary to differentiate the signals produced by the transducing head and the resultant waveform exhibits the positive and negative excursions about the neutral axis referred to above, a flux reversal in the magnetic medium being represented in the waveform as a point at which the waveform trace crosses the axis. Hence, such crossover points are indicative of significant digital representations in the magnetic record.

However, in addition to these significant crossovers, other crossovers are frequently detected in an output waveform, being produced by noise in the detection circuits, for example, or simply by minute particles of dirt on the medium. The tendency to produce spurious outputs is increased as, for example, the packing density of digital recording on the medium decreases, the resultant waveform then exhibiting characteristic shoulders at which points noise is the more likely to produce spurious crossovers.

SUMMARY OF THE INVENTION

According to the present invention a waveform-level detector useable in conjunction with an applied waveform having positive and negative excursions relative to a neutral axis to produce an output indicative of significant excursions of the applied waveform across the axis includes means for deriving first signals for all axis crossings, the first signals being delayed respectively by predetermined time intervals with respect to the axis crossing times; means for deriving second signals in respect of each transition of the waveform across that zone lying between a pair of reference levels lying one on each side of the axis and means for combining said first and second signals to produce delayed signal outputs only in respect of significant axis crossings.

The first signals may be delayed by a delay element having a predetermined time delay or, alternatively a monostable element having a predetermined time delay for resetting may be employed in conjunction with other logic circuitry to provide the delay.

Logic circuitry for developing pulse trains from an interpreteded transducer output may consist of NOR gating or alternatively exculsive OR gates may be used to achieve the same end.

BRIEF DESCRIPTION OF THE DRAWINGS

Apparatus embodying the present invention will now be described, by way of example, with reference to the accompanying drawings, in which FIG. 1 is a schematic diagram of apparatus for reading stored data from a magnetic medium, FIG. 3 is a schematic diagram of a waveform-level detector circuit.

DESCRIPTION OF THE PREFERRED EMBODIMENTS

Referring now to FIG. 1, apparatus for reading data from a magnetic record medium has a transducer forming a read head 1. The output of the head 1 is passed through an amplifier (not shown) to a conventional differentiating circuit 2. The output of the circuit 2 is applied to a waveform-level detector circuit 3 which produces output signals representing stored digital data on a line 4. The line 4 will, when apparatus is in use, be connected to equipment which processes the information, for example, a decoder or computer.

Figure 2:
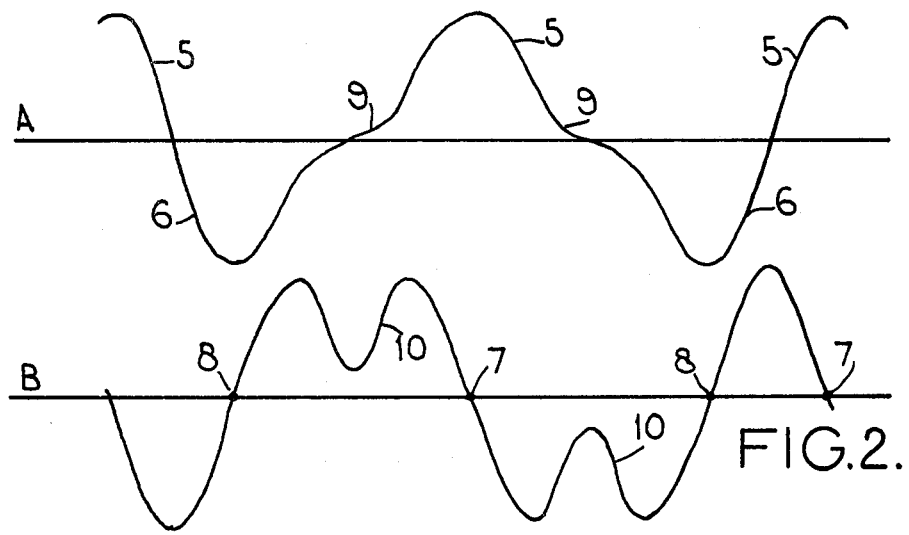
FIG. 2 is a waveform diagram.

FIG. 2 shows, as waveform A, the general shape of the output available from the head and its amplifier to form the input to the differentiating circuit 2, as indicated in FIG. 1. The waveform A contains consecutive positive and negative excursions 5 and 6 about neutral axis resulting from successive flux reversals on the recording medium. As the instant at which a waveform crosses the axis can be detected more reliably than the instant at which it has zero slope, the peaks of the pulses 5 and 6, which indicate the actual timings of the flux reversals, are usually detected by differentiating the head output (to give a waveform B) and then detecting where the waveform B crosses the axis, that is, as shown at points 7 for positive pulses and points 8 for negative pulses.

If the code by which bits are represented on the magnetic medium allows widely spaced reversals, or if the band-width of the head circuits are sufficiently wide (as is desirable for accurate timing) some at least of the pulses of the head output may be separated by shoulders 9. These shoulders, when differentiated, cause dips 10 between peaks in the waveform B. It will be realised, therefore, that this waveform is the generalised form of waveform to which level detection (or, more exactly, axis cross-over detection) is to be applied by the waveform-level detector circuit 3.

The arrangement of circuit elements in the detector circuit 3 are shown in greater detail in FIG. 3, and referring now to this Figure, the input to the circuit 3 is supplied to a crossover detector 11 and a zone transition detector 12. The output of the crossover detector 11 is fed through a pulse forming circuit 13 and a delay element 14 to one input of an AND gate 15. The output of the zone transition detector 12 is fed through a pulse-forming circuit 16 to a second input of the AND gate 15. The gate 15 provides an output 4 from the circuit 3.

Figure 4:
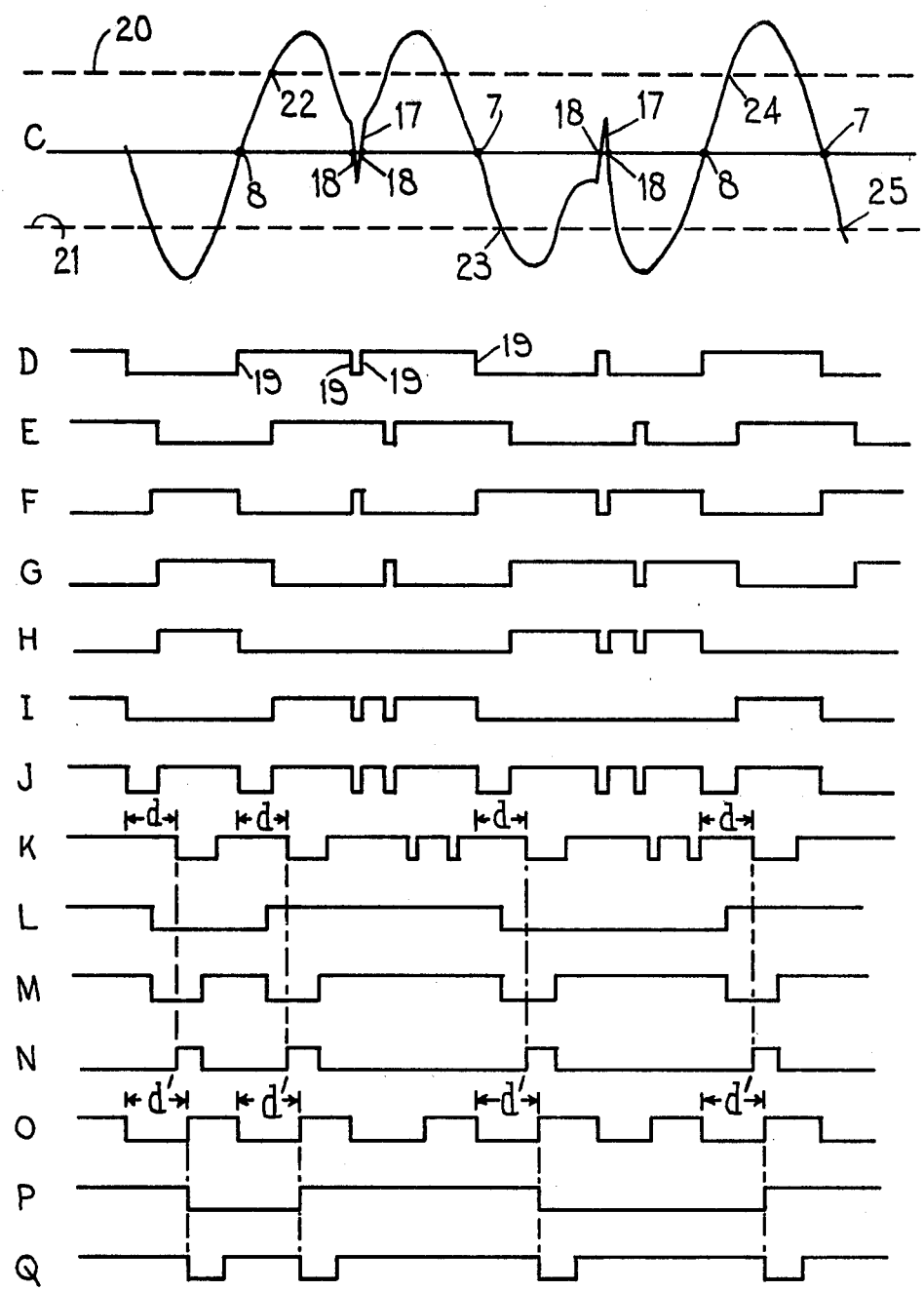
FIG. 4 is another waveform diagram.

As has been noted earlier, in practice spurious crossovers are produced in the waveform actually applied to the detector circuit 3. FIG. 4 shows typical waveforms occurring at various points in the circuits to be described in detail and a letter reference associated with each waveform of FIG. 4 is also introduced into the various other Figures at the appropriate points. Thus in FIG. 4, the input waveform C to the detector is shown in modified form from the idealised waveform B of FIG. 2. It has been supposed that spurious axis crossover points 18 have been introduced by noise spikes 17 superimposed upon the dips 10 of the waveform B (FIG. 2). Clearly these spurious axis crossovers are required to be ignored in evaluating the signal read from the transducing head 1 (FIG. 1).

Referring again to FIG. 4, the crossover detector 11 produces a square-wave output waveform D which changes its state from a fixed voltage level when the input waveform C is a positive signal to a fixed voltage level of opposite sign when the waveform is negative. Thus the waveform D is actually a stylised waveform indicating transitions of the input waveform from one polarity to the other by transitions 19 from one state to another, and it will be readily realised that the waveform transitions 19 actually indicate the timings of axis crossovers in the applied waveform C.

After passing through the pulse-forming circuit 13 the waveform D becomes a waveform J in which a pulse of predetermined length is produced for each transition 19 of waveform D, provided that these transitions occur at a greater time interval than a predetermined period. If the change of state between two adjacent transitions 19 is for less than the predetermined period, separated short pulses are produced. The waveform J is delayed by the delay 14 for a fixed period, $d$, but is otherwise unchanged and is shown as waveform K.

The zone transition detector 12 produces a square-wave output L which changes state in response to the waveform C crossing one of two reference levels 20 and 21 respectively above and below the zero axis for the first time since it last crossed the other. Thus, it changes state at a point 22 on the reference level 20 and then not again until the waveform C next crosses the other reference level 21, at a point 23. A subsequent change of state occurs similarly at point 24.

The pulse-forming circuit 16 acts in a similar way to the pulse-forming circuit 13 and converts the waveform L into a waveform M which has pulses for each change of state of the waveform L.

The waveform K contains information about the time of axis crossings whether they are genuine crossings such as 7 and 8, or are spurious crossings 18 and the timing indicated is delayed from true timing by an accurately determined period. In the waveform L, information on the spurious crossings 18 has been eliminated, but the timing of transitions in this waveform is rendered uncertain by variation in the slope of the waveform C (such as by variation in the distance between successive flux reversals). The delay $d$ of the delay element 14 is chosen to bring the leading edges of genuine pulses from the waveforms C and J inside the pulses on the waveform M. Combining the two waveforms K and M through AND gate 15 then produces a waveform N from which false pulses resulting from the crossings 18 have been removed. The leading edges of the pulses on this waveform are signals accurately related to the cross-overs 7 and 8 but delayed by the period determined by the delay element 14.

Figure 5:
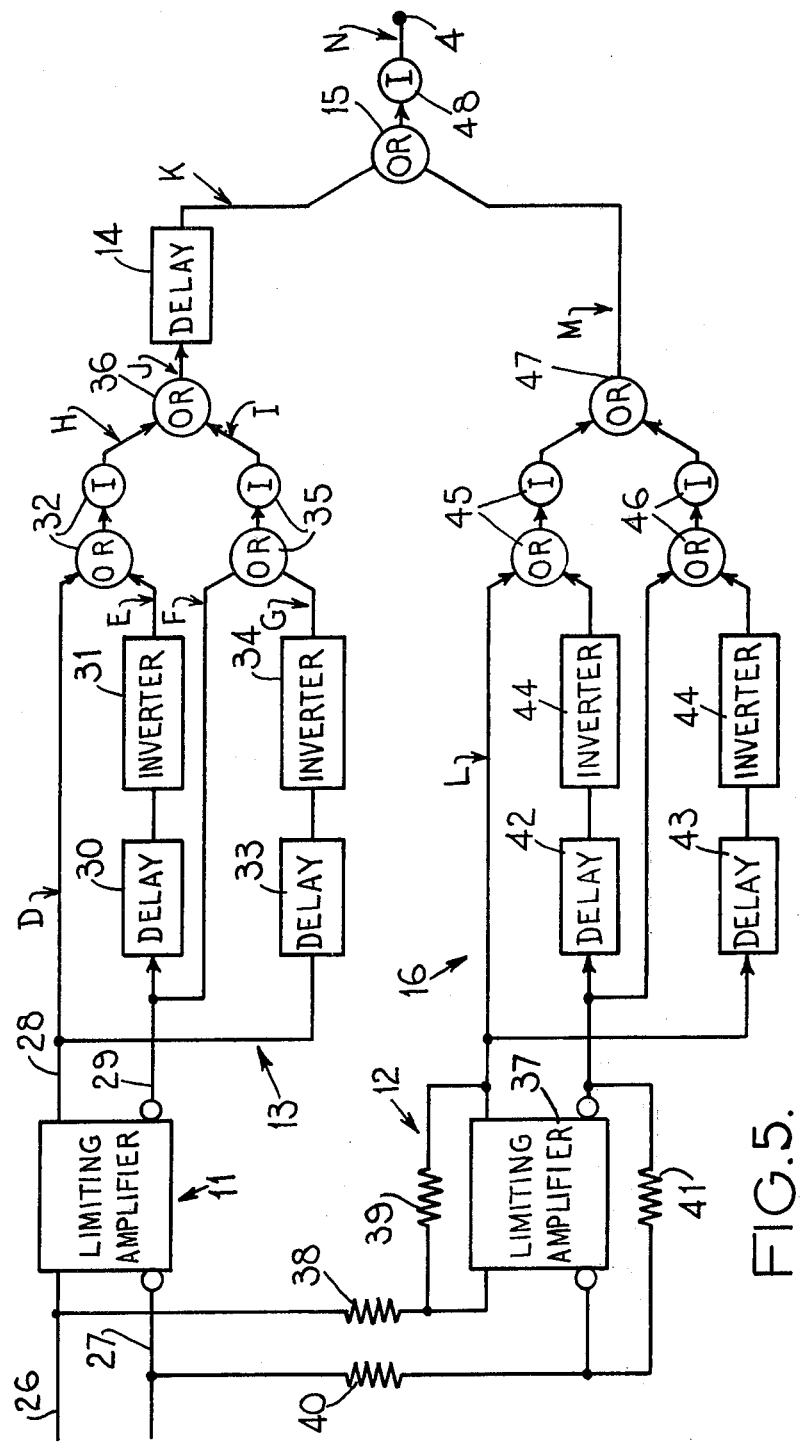
FIG. 5 shows the detector circuit of FIG. 3 in greater detail.

Details of the circuit 3 will now be described with reference to FIG. 5, and illustrated by the waveforms of FIG. 4.

The crossover detector 11 is a limiting amlifier of a well known kind, readily obtainable in integrated circuit form. It receives one input from the differentiating circuit over a line 26 and an inverted input, of equal magnitude but of opposite sign, from a line 27. The output is a voltage signal on lines 28 and its inverse on a line 29. When the input on the line 26 corresponds to a positive excursion of waveform C above the axis, the amplifier 11 produces a constant positive voltage (the upper state of the waveform D) and when the input corresponds to a negative excursion, it produces a constant negative voltage. Thus, as noted earlier, the waveform D is actually a square-wave stylised waveform corresponding to the input waveform C.

The pulse-former circuit 13 includes a NOR gating arrangement using a pair of delay elements 30 and 33 to produce an output in which spurious crossovers are distinguished from significant ones. Thus the output waveform D on line 28 is applied to a NOR gate 32 formed by an OR gate followed by a signal inverter element. A second input to the NOR gate 32 is obtained from the waveform on line 29 (which is the inverse of the waveform D) by delaying in the element 30 and inverting in the element 31 to produce a new waveform E. Because the waveform on line 29 is an inversion of that on line 28, the two waveforms become the same after inversion of that on line 29 and the resultant waveform E is effectively the same as waveform D subjected to a delay.

The NOR gate 32 in response to waveforms D and E produces an output waveform H which is applied to one input of OR gate 36.

A second NOR gate 35, again consisting of an OR gate followed by an inverter produces a waveform I from input waveforms F and G. The waveform F is that from the line 29 while waveform G is obtained by applying the waveform from line 28 through the delay element 33 and an inverter 34. Hence the inputs to the NOR gate 35 are inversions of those to the NOR gate 32 and the resultant output waveform I resembles the waveform H with its component transitions displaced according to the polarity of the excursions of the original waveform C.

The output I of NOR gate 35 is applied as a second input to OR gate 36 and the result of the application of waveforms H and I is an output waveform illustrated at J. Analysis of this waveform shows that for every significant crossover 7 or 8 a negative going pulse is produced whose duration is determined by the delay elements 30 and 33. The spurious crossovers 18 produce pairs of short pulses whose duration is determined by the pulse width of the noise spikes 17 and whose leading edge separation is determined by the delay elements 30 and 33.

The zone transition detector 12 of FIG. 3 is formed by a limiting amplifier 37 (FIG. 5) similar to the amplifier 11. One input of the amplifier 37 is connected to the line 26 through resistor 38. The second input of the amplifier 37 is connected to the line 27 through resistor 40. Positive feedback paths from the outputs of the amplifier 37 are provided to the inputs through resistors 39 and 41 respectively.

The connection of the amplifier 37 in this way results in the establishment of the threshold reference voltage levels 20 and 21 in relation to the waveform C of FIG. 4, and the operation of the amplifier 37 is such that as the applied waveform C falls from a positive peak, the feed-back component preserves the input voltage in a positive sense until the threshold point is reached at the negative voltage reference level 21, the exact threshold being determined, for example, by the relative values of resistors 38 and 39. At this point the output waveform L changes to its negative value and the other feedback path ensures that the output remains in this state until the second reference level 20 is reached. The reference levels 20 and 21 are chosen to be lower in magnitude than peaks expected in the waveform C, but, as far as possible, greater than any noise spikes which cross the axis of the waveform.

The outputs of the amplifier 37 are applied to a NOR gate arrangement similar to that of the amplifier 11 and delay elements 42 and 43 are used in conjunction with inverters 44 in the same way as is described in connection with the amplifier 11 to produce outputs from a pair of NOR gates 45 and 46, these outputs then being combined by an OR gate 47 to produce an output having a waveform M.

The OR gate 15 combines the waveform K and M to produce an output waveform which is then inverted by an inverter 48 to produce the final output waveform N. It will be appreciated that the OR gate 15 and the inverter 48 together form a NOR gate arrangement.

The period, $d$, introduced by the delay 14, applied to the waveform J in order to produce waveform K, is chosen to be just greater than the greatest time period expected to elapse between successive crossings of the input waveform C over its axis and one of the reference line 20 or 21. The delays 42 and 43 are chosen to be long enough to ensure that the pulses in the waveform M overlap the leading edges of corresponding pulses in the waveform K, and are conveniently the same as the delays 30 and 33.

It will be seen that the arrangement described above, in principle provides firstly a circuit for identifying axis crossovers of any kind and for producing a pulse train in which not only does every pulse represent a crossover but one edge of each pulse bears a fixed and predictable time relationship to the actual timing of the crossovers themselves. At the same time, another part of the circuit, because it relies upon crossings over thresholds represented by the reference levels 20 and 21, detects only the significant crossovers; and produces a pulse train that contains only signals in respect of these crossovers. Finally, these two pulse trains are combined to produce an output in which the significant crossovers only are indicated by signals which have accurately predictable delay time periods from the actual timings of the crossovers in the waveform C.

Figure 6:
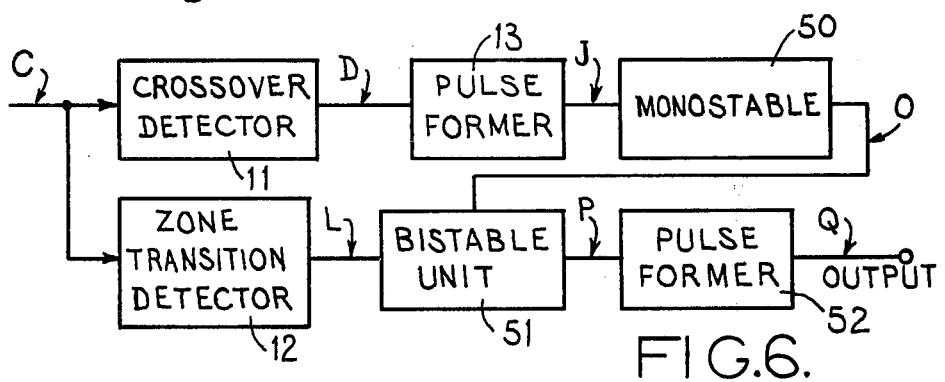
FIG. 6 is a schematic diagram of an alternative form of waveform-level detector.

It is apparent, then, that the accuracy of the delay timings of the output pulses is of importance in enabling the true crossover timings to be established in the apparatus which will use the output produced. While the circuit described above uses a signal delay element for producing the delayed waveform,, it will be realised that other methods of producing a delay may alternatively be used. For example, the intrinsic resetting time of a monostable element may be used to establish this delay period. FIG. 6 is a schematic diagram of an arrangement using this technique.

In FIG. 6 the crossover detector 11 to which the input waveform C is applied is succeeded, as before, by the pulse former 13 which produces the waveform J at its output as described above. In this case, however, the waveform J is applied to set a monostable element 50 which has a predetermined automatic resetting period $d'$. The zone transition detector 12 functions as before and produces its output L which is applied together with an output O from the monostable element 50 to a bistable element 51. The bistable element 51 produces an output P which is applied to a pulse former 52 in order to provide a final output Q.

Figure 7:
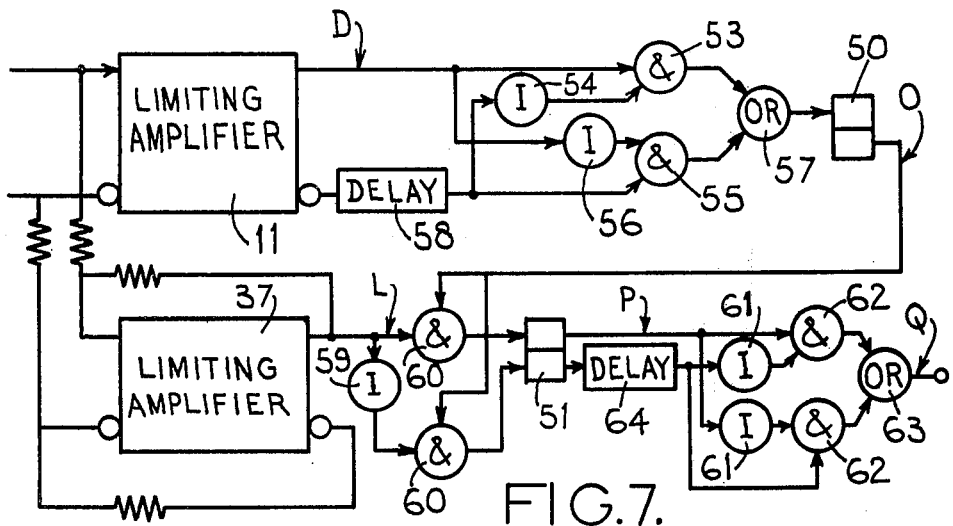
FIG. 7 shows the detector circuit of FIG. 6 in greater detail.

FIG. 7 shows the circuit of the arrangement of FIG. 6 in greater detail, the waveforms referred to being shown in FIG. 4. The crossover detector 11 is a limiting amplifier as previously described and produces the waveform D and its inverse as before. The pulse former 13 may, of course, be similar to that previously described to produce the waveform J. This waveform may alternatively be produced by other logic element arrays and FIG. 7 shown an alternative pulse former using an exclusive OR gate arrangement for the pulse former 13, in which the waveform D is applied to an input of an AND gate 53 whose other input receives the inverted output from the detector 11 through a delay element 58 and an inverter 54. The inverter 54 ensures that the two inputs to AND gate 53 have the same relative polarity. A second AND gate 55 has for its inputs the waveform D applied through an inverter 56 and the inverse output of the detector 11 applied through the delay element 58. The outputs of AND gates 53 and 55 are applied as inputs to OR gate 57 to produce the waveform J at the output of the OR gate 57.

The OR gate 57 output is applied to monostable element 50 which is switched to produce negative output pulses by the leading negative-going edges of pulses in the waveform J. The resetting period $d'$ of the monostable element 50 is sufficiently long so that it produces negative-going pulses for each of the significant crossovers as shown and also bridges non-significant pair of pulses produced in the waveform J by the transitions 18 of a noise spike 17. These pulses are shown as waveform O.

As in the earlier-described case, the zone transition detector 12 is provided by a limiting amplifier 37 with positive feed-back which produces the waveform L as in the earlier example. In the present case, the waveform L and its inverse (which is produced by inverter 59, for example) are applied respectively to condition one of a pair of AND gates 60. The output from the monostable element 50 is applied to the AND gates 60, whose outputs are connected to the setting and unsetting inputs of the bistable element 51. This arrangement ensures that the bistable element 51 is switched between its two stable states by positive-going edges of successive pulses from monostable element 50 only if the zone transition detector amplifier output (waveform L) has changed state since the last monostable output pulse and produces output waveform D and its inverse.

An exclusive OR gating network 52, consisting of inverters 61, AND gates 62 and an OR gate 63, connected as described for the exclusive OR gate pulse former 13 is then used in conjunction with the waveform P and its inverse applied through a delay element 64 to produce an output shown at Q in FIG. 4.

As in the earlier example the final output Q has a negative-going pulse for each significant crossover only in the waveform C and each one of these pulses is delayed by the monostable delay period $d'$ from the true time of the crossover's occurrence. Hence this circuit too, allows the identification of the significant crossovers only to be combined with an accurately determinable time relationship derived for all crossovers to be employed to produce an accurately timed indication of only the significant crossovers.

It will be realised that although the pulse formers consisting of a NOR gating arrangement have been described in conjunction with a signal delay element while those using exclusive OR gating arrangements have been described in conjunction with a monostable delay-timing element, there is no intention to restrict either the pulse formers or, indeed, the delay time generation to the particular combinations shown. Hence, any suitable form of pulse former may be utilized in conjunction with any suitable means for accurately timing the delay period.

The use of the above described circuits does enable apparatus for reading data from a magnetic record to cope with a form of recording in which noise spikes occur on parts of the head waveform, such as A (FIG. 2), having a low slope at axis crossings. This ability permits the use, in the data recording apparatus, of recording codes requiring a greater bandwidth, or in which flux reversals are to be more widely spaced than is possible otherwise. Equally, if required, the response of the arrangement may be boosted in the high-frequency region, to give narrow pulses and, consequently, more accurate timing.

What is claimed is:

1. A waveform-level detector useable in conjunction with an applied waveform having positive and negative excursions relative to a neutral axis to produce an output indicative of significant excursions of the applied waveform across the axis, and a zone lying between a pair of reference levels one on each side of the axis, the detector including;

means responsive to changes in polarity of the waveform to produce a stylised waveform output first signals for all the axis crossings;

first pulse forming means responsive to the stylised output to produce a first pulse train output in which each axis crossing of the applied waveform is represented by a different pulse, the relative timings of the pulses in the first train corresponding to the relative timings of the axis crossings;

means for delaying the first pulse train to enable the pulses each to occur a predetermined time interval after that axis crossing to which it corresponds;

means for deriving second signals from the applied waveform in respect of each transition of the applied waveform across each zone laying between the pair of reference levels; and means for combining the delayed final pulse train and the second signals thereby to produce delayed signal outputs only in respect of significant axis crossings.

2. A waveform-level detector as claimed in claim 1 in which the first pulse train delaying means includes a signal delay element having a predetermined time delay and in which the combining means includes pulse forming means arranged to produce a second pulse train having a separate pulse for each significant axis crossing and a NOR gate arranged to receive the delayed first and the second pulse trains to provide said delayed signal outputs.

3. A waveform-level detector as claimed in claim 1 in which the first pulse train delaying means includes a monostable element arranged to be switched to a set state by pulses in the first train and being reset from said set state to an unset state after a predetermined time delay and in which the combining means includes a bistable element; and AND gating arrangement to permit said second signals to be applied to switch the bistable element alternately between stable states only if one of said second signals has occurred since last the monostable element was reset and an exclusive OR gate coupled to an output of the bistable element to produce said delayed signal outputs.

4. A waveform-level detector as claimed in claim 1 in which a pulse forming means includes a pair of NOR gates, one gate of the pair receiving an input signal and a delayed signal derived therefrom while the second gate of the pair receives an inversion of the same input signal and a delayed signal derived from the inversion, the outputs of the pair of NOR gates being applied through an OR gate to produce a pulse train.

5. A waveform-level detector as claimed in claim 1, in which a pulse forming means includes an exclusive OR gating array arranged to receive an input signal and a delayed inversion of that input signal to produce an output pulse train.

* * * * *